US008279029B2

(12) United States Patent  
Chamuczynski et al.

(10) Patent No.: US 8,279,029 B2  
(45) Date of Patent: Oct. 2, 2012

(54) WEATHERPROOF SWITCH FOR INDOOR AND OUTDOOR INFORMATION CLUSTERS AND FUNCTION SWITCHES

(75) Inventors: Przemyslaw Chamuczynski, Toronto (CA); Allan Chun, Brooklin (CA)

(73) Assignee: Flextronics Automotive, Inc., Scarborough, Ontario (CA)

( * ) Notice: Subject to any disclaimer, the term of this patent is extended or adjusted under 35 U.S.C. 154(b) by 372 days.

(21) Appl. No.: 12/216,759

(22) Filed: Jul. 10, 2008

(65) Prior Publication Data  
US 2010/0007402 A1 Jan. 14, 2010

(51) Int. Cl.  
*H01H 9/00* (2006.01)

(52) U.S. Cl. ......... 335/205; 335/206; 335/207; 335/153

(58) Field of Classification Search ......... 335/145, 335/151–153, 205–207; 197/98, 102, 103; 340/945, 988, 998; 341/22, 32; 361/680, 361/681, 697, 704, 816, 736, 707, 709, 742, 361/713, 748, 714, 752, 760, 388, 725, 724, 361/753; 338/69, 28, 344, 296; 200/51 R, 200/52 R, 11 R, 61.39, 51.17, 173  
See application file for complete search history.

(56) References Cited

U.S. PATENT DOCUMENTS

| 3,051,805 | A | * | 8/1962 | Binford | 335/48 |
| 3,205,323 | A | * | 9/1965 | Deshautreaux, Jr. | 335/207 |
| 3,227,838 | A | * | 1/1966 | Hoeppel | 335/153 |
| 3,360,627 | A | * | 12/1967 | Wessel | 200/302.2 |
| 3,443,043 | A | * | 5/1969 | Thormann et al. | 335/205 |
| 3,448,419 | A | * | 6/1969 | Myatt | 335/206 |
| 3,529,269 | A | * | 9/1970 | Gardiner | 335/207 |
| 3,560,846 | A | * | 2/1971 | Bessko | 335/153 |
| 3,579,160 | A | * | 5/1971 | Mackway | 335/206 |
| 3,588,766 | A | * | 6/1971 | Baermann | 355/207 |
| 3,636,370 | A | * | 1/1972 | Samberger et al. | 307/116 |
| 3,644,855 | A | * | 2/1972 | Cherry et al. | 335/205 |
| 3,678,424 | A | * | 7/1972 | Iwashima et al. | 335/206 |
| 3,689,859 | A | * | 9/1972 | Straub | 335/206 |
| 3,693,123 | A | * | 9/1972 | Pedersen | 335/206 |
| 3,713,056 | A | * | 1/1973 | Hosokawa | 335/206 |
| 3,748,415 | A | * | 7/1973 | Suzuki | 200/61.45 M |
| 3,848,216 | A | * | 11/1974 | Gamble | 338/32 H |

(Continued)

FOREIGN PATENT DOCUMENTS  
WO WO 2009/005568 A1 1/2010

OTHER PUBLICATIONS

PCT Notification of Transmittal of the International Search Report; (Aug. 27, 2009); (PCT/US2009/03997).

*Primary Examiner* — Mohamad Musleh  
(74) *Attorney, Agent, or Firm* — Volpe and Koenig, P.C.

(57) ABSTRACT

A weatherproof switch for use with an information/instrument cluster including a button having a body located adjacent to the information/instrument cluster, the body having a first end and a second end; a magnet substantially disposed within the second end of the body; a sensor located a distance from the magnet to produce a magnetic field of a first strength; and a circuit connecting the sensor to a function of the information/instrument cluster for controlling the function when the first end of the button is operated to increase and decrease the distance between the magnet and the sensor such as to produce magnetic field of a second strength.

2 Claims, 8 Drawing Sheets

U.S. PATENT DOCUMENTS

| | | | |
|---|---|---|---|
| 3,873,957 A * | 3/1975 | Wurscher et al. | 338/32 H |
| 3,904,887 A * | 9/1975 | Hagelbarger | 307/139 |
| 3,906,417 A * | 9/1975 | Serras-Paulet | 335/205 |
| 3,934,215 A * | 1/1976 | Rich et al. | 335/207 |
| 4,303,856 A * | 12/1981 | Serras-Paulet | 250/229 |
| 4,644,315 A * | 2/1987 | Hodges | 338/2 |
| 4,674,896 A * | 6/1987 | Yasunaga et al. | 400/124.2 |
| 5,197,321 A * | 3/1993 | Both | 318/490 |
| 5,525,846 A * | 6/1996 | Newell et al. | 307/125 |
| 6,246,307 B1 * | 6/2001 | Friedman | 335/205 |
| 7,187,296 B2 * | 3/2007 | Luberda et al. | 340/815.4 |
| 7,375,300 B2 * | 5/2008 | Pedersen et al. | 200/341 |
| 7,463,128 B2 * | 12/2008 | Seo | 335/285 |
| 7,504,918 B2 * | 3/2009 | Prendergast et al. | 335/205 |
| 2003/0214374 A1 | 11/2003 | Van Zeeland | |
| 2005/0035836 A1 * | 2/2005 | Howard et al. | 335/205 |
| 2005/0077988 A1 | 4/2005 | Van Zeeland et al. | |
| 2006/0082429 A1 | 4/2006 | Lynch et al. | |
| 2007/0219409 A1 * | 9/2007 | Shimizu et al. | 600/112 |
| 2008/0198042 A1 * | 8/2008 | Quigley et al. | 340/988 |

* cited by examiner

WEATHERPROOF SWITCH FOR INDOOR AND OUTDOOR INFORMATION CLUSTERS AND FUNCTION SWITCHES

BACKGROUND

Information clusters quite often use switches/buttons to allow a user to interface with the information cluster functions. Mounting the buttons require that the cluster lens or housing have an opening through which the button protrudes and physically interfaces with the electronics inside. Protruding buttons have to be well sealed to prevent moisture from entering the inside of the information cluster housing. Unfortunately, the sealing of the button quite often degrades with time and creates a risk of water intrusion into the information cluster housing, thus causing damage to the electrical and mechanical components inside the information cluster housing.

Current switches use a mechanical button that utilizes a rubber boot containing a metal stem. When pressed, the stem pushes downward on a switch cell mounted to the printed circuit board. This methodology requires that there be an opening in the lens for the stem. In order to protect the internal circuitry from external environmental influence, it is necessary to press-fit the lens opening and the button body. However, the sealing of the button often degrades with time and creates a risk of moisture intrusion and cluster damage.

SUMMARY

The above-described problems are solved and a technical advance achieved by the weatherproof switch for indoor and outdoor information clusters and function switches ("weatherproof switch") disclosed in this application. The novel weatherproof switch may be used in any type of environment, such as for information/instrument clusters and the like. The weatherproof switch may include a button embedded with a magnet that interacts with a information/instrument cluster equipped with a magnetic sensor, and in some cases a means for conducting the magnetic field between the magnet and the magnetic sensor.

When the button is pressed, the magnetic sensor inside the information/instrument cluster detects the magnetic field of the magnet within the button. Because the button press is detected by a change in the magnetic field of the magnetic sensor, the lens and/or housing of the information/instrument cluster does not have any physical openings for the button. The information/instrument cluster remains sealed and there is no risk of water intrusion.

The present weatherproof switch includes a button that embeds a magnet. The magnet is press fitted, glued, overmolded, and the like, after which it is fully surrounded by the button material and sealed from the environment. The button may not have to physically interface with any of the internal parts of the information/instrument cluster. The present weatherproof switch may include a stand-alone environmentally sealed switch assembly that communicates with the weatherproof switch by physical connections, such as wiring, cables, and the like, using analog signals, for example. In another aspect, the sealed switch assembly may communicate with the weatherproof switch using digital signal through such wiring and cables using a digital communications protocol, such as through a controller area network ("CAN"), local area network ("LAN"), and the like. Further such communication may be via wireless methods or protocols using digital communication protocols as are commonly known to those skilled in the art.

The present weatherproof switch does not require an opening in the lens to operate the functionality associated with a particular weatherproof switch. A sensor detects through the lens of a information/instrument cluster a button being pressed and acts as a switch. This greatly reduces the potential of seal failure, and protects the module from the environmental influence. Moreover, the encapsulation of the magnet in the button also protects it from external influences as well, thus providing a weatherproof switch.

One embodiment includes the present weatherproof switch a button having a body located adjacent to the information/instrument cluster, the body having a first end and a second end; a magnet substantially disposed within the second end of the body; a sensor located a distance from the magnet to produce a magnetic field of a first strength; and a circuit connecting the sensor to a function of the information/instrument cluster for controlling the function when the first end of the button is operated to increase and decrease the distance between the magnet and the sensor such as to produce magnetic field of a second strength.

In another embodiment the present weatherproof switch includes an information/instrument cluster for use on a vehicle including a first instrument having a housing, the housing having an interior and an exterior, a button having an elongated body located adjacent to the exterior of the housing, the elongated body having a first end and a second end; a magnet substantially disposed within the second end of the elongated body; a sensor located a distance from the magnet to produce a magnetic field of a first strength; and a circuit connecting the sensor to a function of the information/instrument cluster for controlling the function when the first end of the button is operated to increase and decrease the distance between the magnet and the sensor such as to produce a magnetic field of a second strength.

In yet another embodiment, the present weatherproof switch includes an information/instrument cluster for use on a vehicle including at least one instrument having a housing; a lens having a flexible portion located on the housing; a magnet disposed substantially to the flexible portion; a sensor located a distance from the magnet to produce a magnetic field of a first strength; and a circuit connecting the sensor to a function of the information/instrument cluster for controlling the function when the flexible portion is operated to increase and decrease the distance between the magnet and the sensor such as to produce a magnetic field of a second strength.

BRIEF DESCRIPTION OF THE DRAWINGS

Illustrative embodiments of the present invention are described in detail below with reference to the attached drawing figures, which are incorporated by reference herein and wherein.

DETAILED DESCRIPTION

Figure 1:
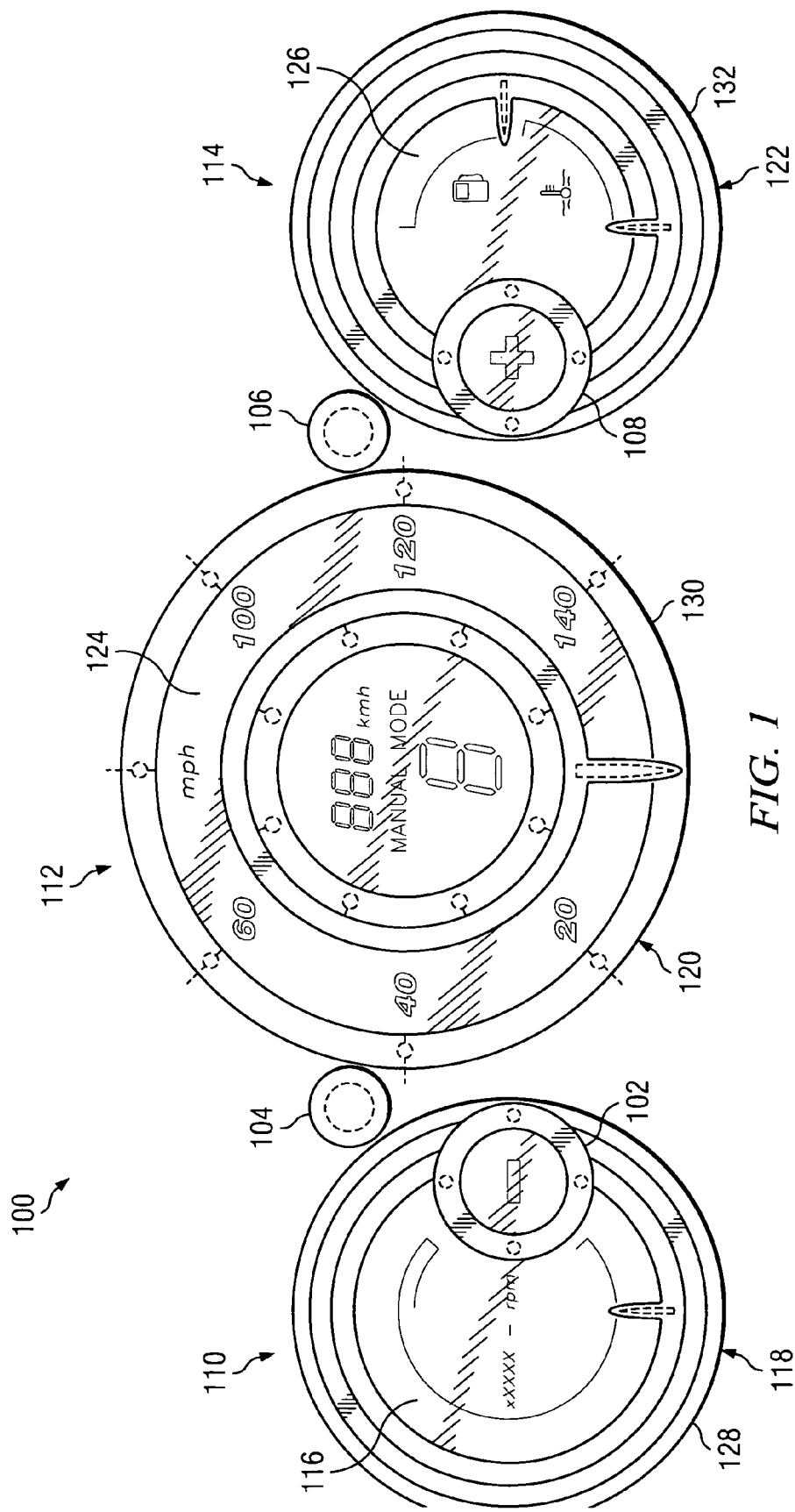
FIG. 1 is a plan view of an exemplary information/instrument cluster with a plurality of weatherproof switches according to an embodiment of the present invention.
Figure 2:
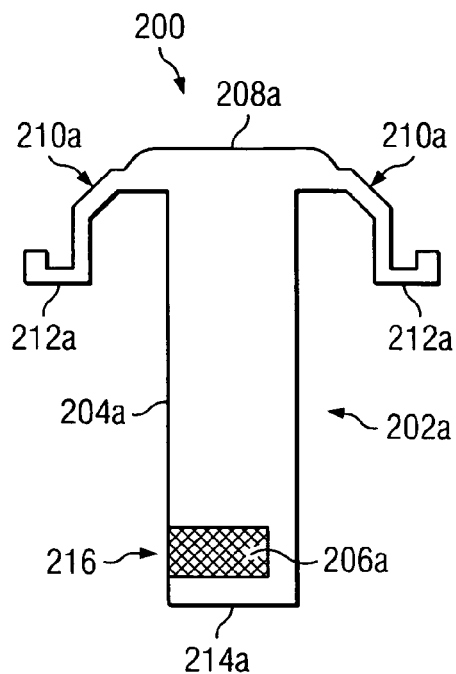
FIG. 2 is a cross-sectional view of an exemplary weatherproof switch having an elongated stem with an interference fit of an embedded magnet according to an embodiment of the present invention.
Figure 3:
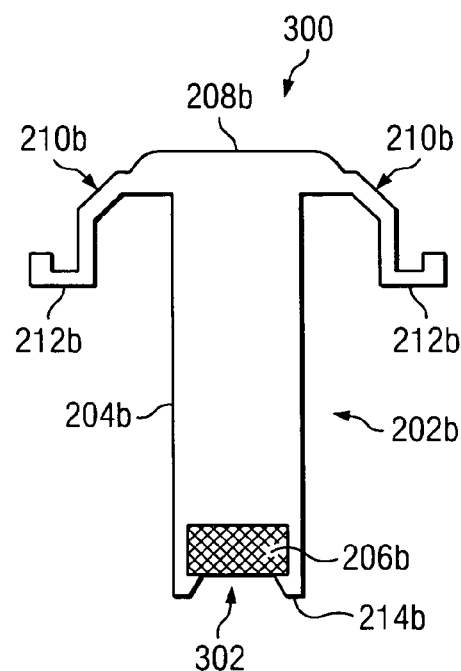
FIG. 3 is a cross-sectional view of an exemplary button of a weatherproof switch having an elongated stem with an interference fit of an embedded magnet according to another embodiment of the present invention.
Figure 4:
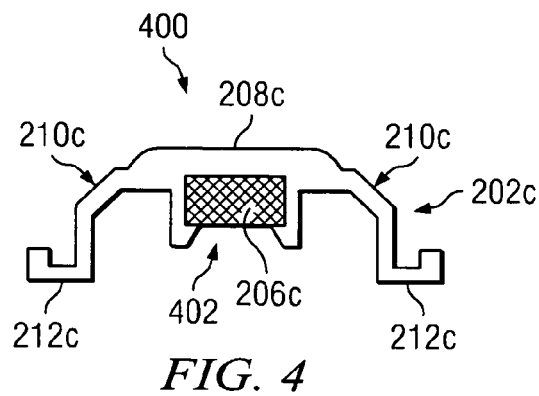
FIG. 4 is a cross-sectional view of an exemplary button of a weatherproof switch with an interference fit of an embedded magnet according to another embodiment of the present invention.
Figure 5:
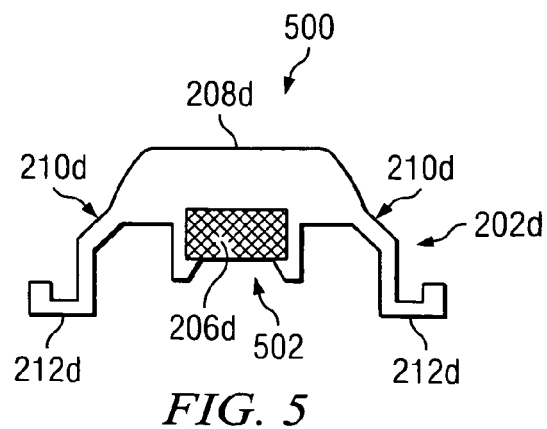
FIG. 5 is a cross-sectional view of an exemplary button of a weatherproof switch with an interference fit of an embedded magnet according to another embodiment of the present invention.

FIG. 1 is an illustration of an embodiment of an information/instrument cluster 100 having a plurality of weatherproof switches 102, 104, 106, and 108 located in different positions among or on several instruments 110, 112, and 114. In one embodiment, the instrument 110 is provided with a housing 118 that includes a bottom wall (not shown) and side wall 128, both having an inner surface and an outer surface. The upper periphery of the side wall 128 along with a lens 116 seals the electronic circuitry within the instrument 110 from the environment outside the information/instrument cluster 100. Similarly, instrument 112 includes a housing 120 that includes a bottom wall (not shown) and side wall 130, both having an inner surface and an outer surface. The upper periphery of the side wall 130 may seal with a lens 124 to seal the electronic circuitry within the instrument 112. Further, the instrument 114 includes a housing 122 that includes a bottom wall (not shown) and side wall 132, both typically having an inner surface and an outer surface. The upper periphery of the side wall 132 may seal with a lens 126 to seal the electronic circuitry within the instrument 114.

Although three instruments 110, 112, and 114 and four weatherproof switches 102, 104, 106, and 108 are depicted in FIG. 1, the present information/instrument cluster 100 and/or weatherproof switch may include any number of instruments or weatherproof switches. In one embodiment, weatherproof switch 104 is located between instruments 110 and 112, and weatherproof switch 106 is located between instruments 112 and 114, nevertheless, any number of instruments may be adjacent to any number of weatherproof switches. Further, the weatherproof switches 102, 104, 106, and 108 may be located in other positions relative to the instruments 110, 112, and 114, as will be described herein.

Weatherproof switch 102 is located on top of the lens 116 of the instrument 110. As described herein, the lens 116 of the instrument 110 does not contain a hole disposed through it for the weatherproof switch 102 to operate with the circuitry contained within the instrument 110. In one embodiment, the weatherproof switch 102 is generally attached, affixed, sealed, and the like to the lens 116 of the instrument 110. It is shown positioned in a particular area of the lens 116, but it maybe located anywhere on top of the lens 116.

Weatherproof switch 104 is located between the outer surface of the side wall 128 of instrument 110 and the outer surface of the side wall 130 of instrument 112. Similarly, weatherproof switch 106 is located between the outer surface of the side wall 130 of instrument 112 and the outer surface of the side wall 132 of instrument 114. The weatherproof switches 104 and 106 may be located substantially adjacent to one or more of the outer side walls 128, 130, and 132, for example. In one embodiment, the weatherproof switches 104 and 106 may have elongated necks, as described further below that extend downward from the upper portions of the switches, such that a magnet contained in the weatherproof switches 104 and 106 is nearer to a sensor contained within the instruments 110, 112, and 114.

Weatherproof switch 108 is incorporated or part of a flexible surface or interface of the housing 122, such as lens 126.

In this embodiment, part of the weatherproof switch 108 may be a flexible or elastic surface that may be pushed or pulled by an operator when operating the weatherproof switch 108. In one embodiment, a magnet, as described below, may be embedded into the flexible part of the information/instrument cluster 100 or weatherproof switch 108, such that no actual button may be required. Function activation may be done by deflecting or applying and releasing pressure at the flexible part of the weatherproof switch 108.

Referring to FIGS. 2-5, illustrations are presented of embodiments of buttons 200, 300, 400, and 500 of a weatherproof switch where a magnet is incorporated into the buttons 200, 300, 400, and 500 by an interference fit or press fit. Button 200 includes a body 202a having an elongated stem 204a that extends from the top 208a to the bottom 214a of the button 200. Near the bottom 214a of the button 200 is a magnet 206a that may be pressed into an interference fit within the cavity 216 of the body 202a. The top 208a of the button 200 may be operated by a user by depressing or otherwise causing the top 208a to be depressed or moved relative to a sensor as discussed further below. The button 200 includes flexible side walls 210a that extend outwardly from the top 208a of the button 200, such that they flex when the top 208a is depressed or moved by a user. The arms 210a may extend to ends 212a that seal against a surface, such as housings 118, 120, and 122, for example. The arms 210a may be of a shape or thickness that allows for the body 202a to be moved relative to the ends 212a by applying a force, such as by pressing, on the top 208a of the button 200 causing the arms 210a to flex. A resistance to the force exerted by a user may be stored in the arms 210a, such that they cause the body 202a of the button 200 to return to its original position once the force has been removed or ceased. In this embodiment, the cavity 216 may include an opening located near the bottom 214a of the body 202a to locate the magnet 206a nearer to one side of the body 202a than another. The side that the magnet 206a is located nearer to may also be the side that is more adjacent to a sensor as described herein.

Button 300 includes a body 202b having an elongated stem 204b that extends from the top 208b to the bottom 214b of the button 300. Near the bottom 214b of the button 300 is a magnet 206b that may be pressed into an interference fit within the cavity 302 of the body 202b. The top 208b of the button 300 may be operated by a user by depressing or otherwise causing the top 208b to be depressed or moved relative to a sensor as discussed further below. The button 300 includes flexible side walls 210b that extend outwardly from the top 208b of the button 300, such that they flex when the top 208b is depressed or moved by a user. The arms 210b may extend to ends 212b that seal against a surface, such as housings 118, 120, and 122, for example. The arms 210b may be of a shape or thickness that allows for the body 202b to be moved relative to the ends 212b by applying a force, such as by pressing, on the top 208b of the button 300 causing the arms 210b to flex. A resistance to the force exerted by a user may be stored in the arms 210b, such that they cause the body 202b of the button 300 to return to its original position once the force has been removed or ceased. In this embodiment, the cavity 302 may include an opening located near the bottom 214b of the body 202b to locate the magnet 206b more central to the bottom 214b than one side or the other. The location of the magnet 206b may be nearer to or more adjacent to a sensor as described herein. The interference fit is shown as having two tabs that are part of the cavity 302, such that the magnet 206b may be pressed and secured into the cavity 302.

Button 400 includes a body 202c, absent an elongated stem as found in buttons 200 and 300, that extends from the top 208c to the cavity 402 of the button 400. Located in the cavity 402 is a magnet 206c that may be pressed into an interference fit within the cavity 402 of the body 202c. The top 208c of the button 400 may be operated by a user by depressing or otherwise causing the top 208c to be depressed or moved relative to a sensor as discussed further below. The button 400 includes flexible side walls 210c that extend outwardly from the top 208c of the button 400, such that they flex when the top 208c is depressed or moved by a user. The arms 210c may extend to ends 212c that seal against a surface, such as lenses 116, 124, and 126, for example. The arms 210c may be of a shape or thickness that allows for the body 202c to be moved relative to the ends 212c by applying a force, such as by pressing, on the top 208c of the button 400 causing the arms 210c to flex. A resistance to the force exerted by a user may be stored in the arms 210c, such that they cause the body 202c of the button 400 to return to its original position once the force has been removed or ceased. In this embodiment, the cavity 402 is located closer to the top 208c for using the button 400 directly on lenses 116, 124, and 126 and/or housings 118, 120, and 122. The location of the magnet 206c may be nearer to or more adjacent to a sensor located proximal to the magnet 206c because of the shortness of the body 202c of the button 400. The interference fit is shown as having two tabs that are part of the cavity 402, such that the magnet 206c may be pressed and secured into the cavity 402.

Button 500 includes a body 202d, also absent an elongated stem as found in buttons 200 and 300, which extends from the top 208d to the cavity 502 of the button 500. Located in the cavity 502 is a magnet 206d that may be pressed into an interference fit within the cavity 502 of the body 202d. The top 208d of the button 500 may be operated by a user by depressing or otherwise causing the top 208d to be depressed or moved relative to a sensor as discussed further below. The button 500 includes flexible side walls 210d that extend outwardly from the top 208d of the button 500, such that they flex when the top 208d is depressed or moved by a user. The arms 210d may extend to ends 212d that seal against a surface, such as lenses 116, 124, and 126, for example. The arms 210d may be of a shape or thickness that allows for the body 202d to be moved relative to the ends 212d by applying a force, such as by pressing, on the top 208d of the button 500 causing the arms 210d to flex. A resistance to the force exerted by a user may be stored in the arms 210d, such that they cause the body 202d of the button 500 to return to its original position once the force has been removed or ceased. In this embodiment, the cavity 502 is located closer to the top 208d for using the button 500 directly on lenses 116, 124, and 126 and/or housings 118, 120, and 122, for example. The location of the magnet 206d may be nearer to or more adjacent to a sensor located proximal to the magnet 206d because of the shortness of the body 202d of the button 500. The interference fit is shown as having two tabs that are part of the cavity 502, such that the magnet 206d may be pressed and secured into the cavity 502.

Referring to buttons 400 and 500, there is a difference in the thickness of their respective bodies 202c and 202d. Body 202d has a slightly thicker portion extending from the top 208d to the cavity 502 than button 400. Similarly, the body 202c of button 400 has a slightly thinner portion extending from the top 208c to the cavity 402 than button 500. These thicknesses of bodies may also be measured from the tops 208c and 208d to the top of the magnets 206c and 206d, respectively. In one aspect, the amount of pressure or force necessary to operate buttons 400 and 500 may be designed by making the buttons 400 and 500 with bodies having a certain thickness, such that the material used will provide a desired resistance to the force or pressure exerted by a user. In another aspect, the type of material used for the bodies 202c and 202d may provide the desired resistance to force and pressure of a user in order to operate the buttons 400 and 500.

Figure 6:
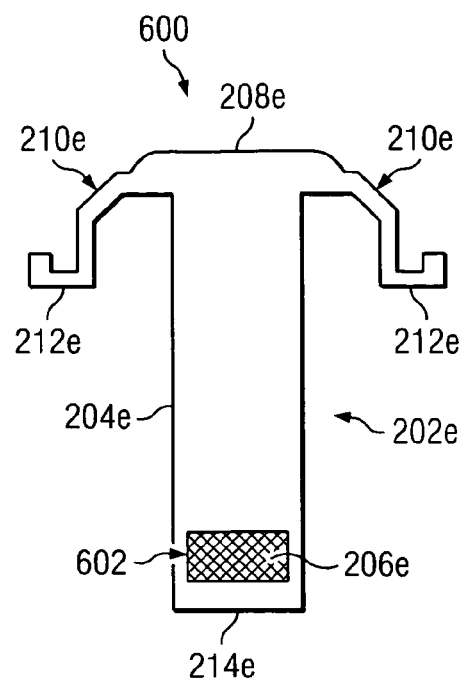
FIG. 6 is a cross-sectional view of an exemplary button of a weatherproof switch having an elongated stem with an embedded overmolded magnet according to another embodiment of the present invention.
Figure 7:
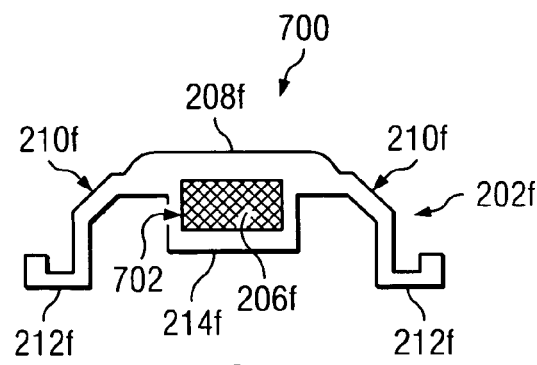
FIG. 7 is a cross-sectional view of an exemplary button of a weatherproof switch with an embedded overmolded magnet according to another embodiment of the present invention.
Figure 8:
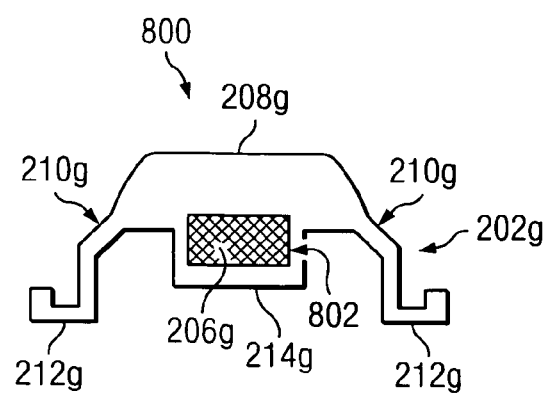
FIG. 8 is a cross-sectional view of an exemplary button of a weatherproof switch with an embedded overmolded magnet according to another embodiment of the present invention.
Figure 9:
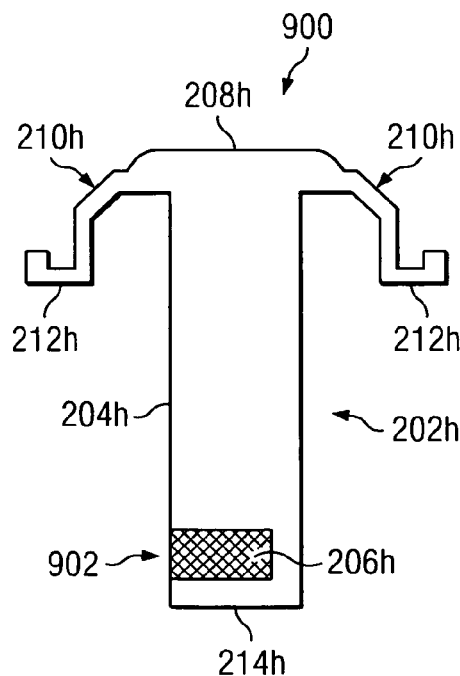
FIG. 9 is a cross-sectional view of an exemplary button of a weatherproof switch having an elongated stem with an embedded glued magnet according to another embodiment of the present invention.
Figure 10:
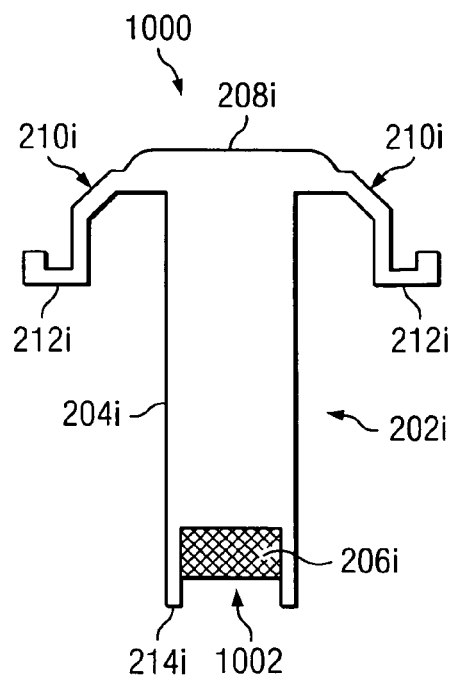
FIG. 10 is a cross-sectional view of an exemplary button of a weatherproof switch having an elongated stem with an embedded glued magnet according to another embodiment of the present invention.
Figure 11:
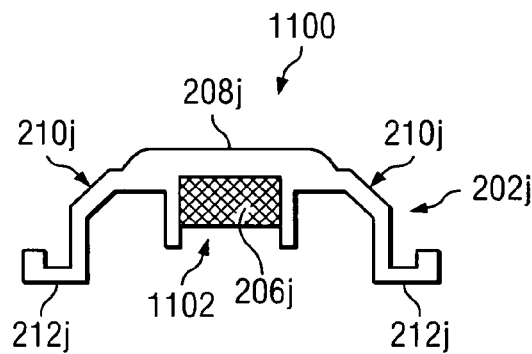
FIG. 11 is a cross-sectional view of an exemplary button of a weatherproof switch with an embedded glued magnet according to another embodiment of the present invention.
Figure 12:
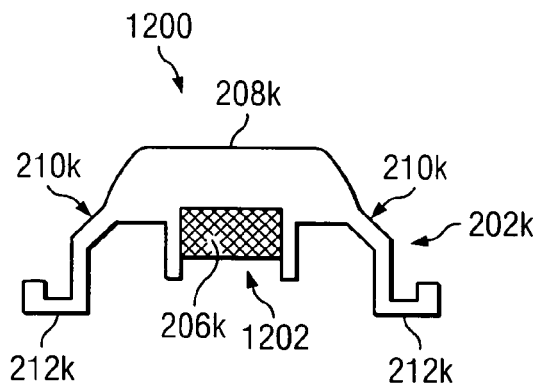
FIG. 12 is a cross-sectional view of an exemplary button of a weatherproof switch with an embedded glued magnet according to another embodiment of the present invention.
Figure 13:
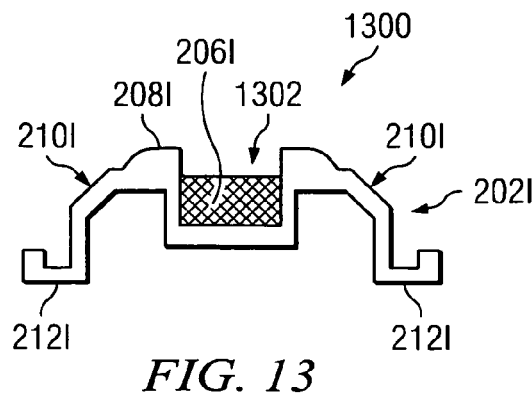
FIG. 13 is a cross-sectional view of an exemplary button of a weatherproof switch with an embedded glued magnet according to another embodiment of the present invention.
Figure 14:
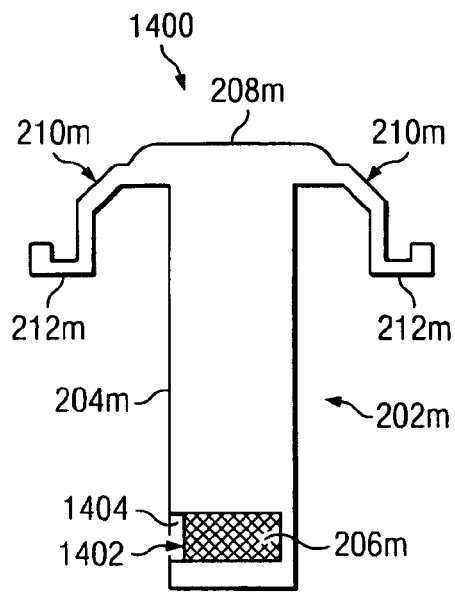
FIG. 14 is a cross-sectional view of an exemplary two-piece button of a weatherproof switch having an elongated stem with an embedded magnet according to another embodiment of the present invention.
Figure 15:
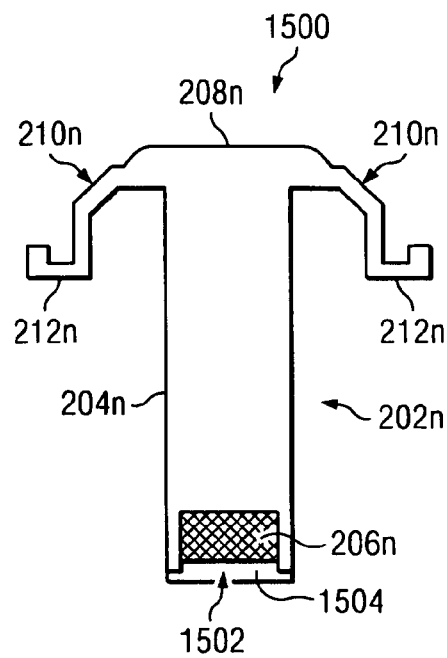
FIG. 15 is a cross-sectional view of an exemplary two-piece button of a weatherproof switch having an elongated stem with an embedded magnet according to another embodiment of the present invention.
Figure 16:
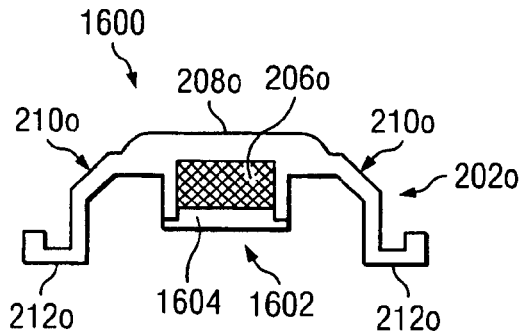
FIG. 16 is a cross-sectional view of an exemplary two-piece button of a weatherproof switch with an embedded magnet according to another embodiment of the present invention.
Figure 17:
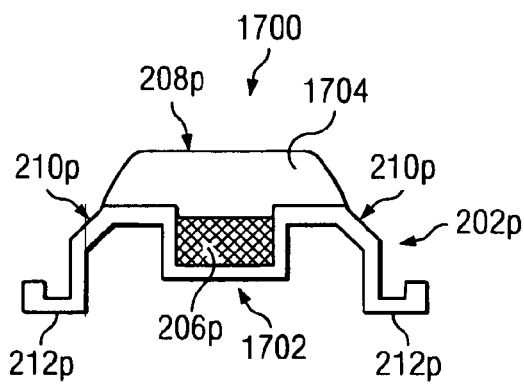
FIG. 17 is a cross-sectional view of an exemplary two-piece button of a weatherproof switch with an embedded magnet according to another embodiment of the present invention.
Figure 18:
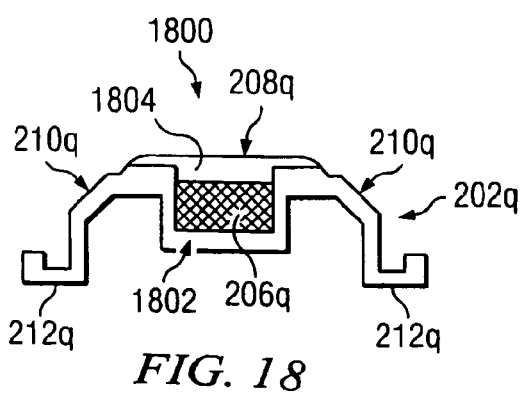
FIG. 18 is a cross-sectional view of an exemplary two-piece button of a weatherproof switch with an embedded magnet according to another embodiment of the present invention.

Referring to FIGS. 6-8, illustrations are presented of embodiments of buttons 600, 700, and 800 of a weatherproof switch where a magnet is incorporated into the buttons 600, 700, and 800 by molding a magnet into a body of the buttons 600, 700, and 800. Button 600 includes a body 202e having an elongated stem 204e that extends from the top 208e to the bottom 214e of the button 600. Near the bottom 214e of the button 600 is a magnet 206e that may be molded or overmolded into the cavity 602 of the body 202e. The top 208e of the button 600 may be operated by a user by depressing or otherwise causing the top 208e to be depressed or moved relative to a sensor as discussed further below. The button 600 includes flexible side walls 210e that extend outwardly from the top 208e of the button 600, such that they flex when the top 208e is depressed or moved by a user. The arms 210e may extend to ends 212e that seal against a surface, such as housings 118, 120, and 122, for example. The arms 210e may be of a shape or thickness that allows for the body 202e to be moved relative to the ends 212e by applying a force, such as by pressing, on the top 208e of the button 600 causing the arms 210e to flex. A resistance to the force exerted by a user may be stored in the arms 210e, such that they cause the body 202e of the button 200 to return to its original position once the force has been removed or ceased. In this embodiment, the cavity 216 may include an opening located near the bottom 214e of the body 202e to locate the magnet 206e nearer to a centrally located sensor as described herein.

Button 700 includes a body 202f, without the elongated stem as found in button 600, that extends from the top 208f to the cavity 702 of the button 700. Located in the cavity 702 is a magnet 206f that may be molded or overmolded within the cavity 702 of the body 202f. The top 208f of the button 700 may be operated by a user by depressing or otherwise causing the top 208f to be depressed or moved relative to a sensor as discussed further below. The button 700 includes flexible side walls 210f that extend outwardly from the top 208f of the button 700, such that they flex when the top 208f is depressed or moved by a user. The arms 210f may extend to ends 212f that seal against a surface, such as lenses 116, 124, and 126, for example. The arms 210f maybe of a shape or thickness that allows for the body 202f to be moved relative to the ends 212f by applying a force, such as by pressing, on the top 208f of the button 700 causing the arms 210f to flex. A resistance to the force exerted by a user may be stored in the arms 210f, such that they cause the body 202f of the button 700 to return to its original position once the force has been removed or ceased. In this embodiment, the cavity 702 is located closer to the top 208f for using the button 700 directly on lenses 116, 124, and 126 and/or housings 118, 120, and 122. The location of the magnet 206f may be nearer to or more adjacent to a sensor located proximal to the magnet 206f because of the shortness of the body 202f of the button 700.

Button 800 includes a body 202g, also absent an elongated stem as found in button 600, which extends from the top 208g to the cavity 802 of the button 800. Located in the cavity 802 is a magnet 206g that may be molded or overmolded within the cavity 802 of the body 202g. The top 208g of the button 800 may be operated by a user by depressing or otherwise causing the top 208g to be depressed or moved relative to a sensor as discussed further below. The button 800 includes flexible side walls 210g that extend outwardly from the top 208g of the button 800, such that they flex when the top 208g is depressed or moved by a user. The arms 210g may extend to ends 212g that seal against a surface, such as lenses 116, 124, and 126, for example. The arms 210g maybe of a shape or thickness that allows for the body 202g to be moved relative to the ends 212g by applying a force, such as by pressing, on the top 208g of the button 800 causing the arms 210g to flex. A resistance to the force exerted by a user may be stored in the arms 210g, such that they cause the body 202g of the button 800 to return to its original position once the force has been removed or ceased. In this embodiment, the cavity 802 is located closer to the top 208g for using the button 800 directly on lenses 116, 124, and 126 and/or housings 118, 120, and 122, for example. The location of the magnet 206g may be nearer to or more adjacent to a sensor located proximal to the magnet 206g because of the shortness of the body 202g of the button 800.

Referring to buttons 700 and 800, there is a difference in the thickness of their respective bodies 202f and 202g. Body 202g has a slightly thicker portion extending from the top 208g to the cavity 802 than button 700. Similarly, the body 202f of button 700 has a slightly thinner portion extending from the top 208f to the cavity 702 than button 800. These thicknesses of bodies may also be measured from the tops 208f and 208g to the top of the magnets 206f and 206g, respectively. In one aspect, the amount of pressure or force necessary to operate buttons 700 and 800 may be designed by making the buttons 700 and 800 with bodies having a certain thickness, such that the material used will provide a desired resistance to the force or pressure exerted by a user. In another aspect, the type of material used for the bodies 202f and 202g may provide the desired resistance to force and pressure of a user in order to operate the buttons 700 and 800.

Referring to FIGS. 9-13, illustrations are presented of embodiments of buttons 900, 1000, 1100, 1200, and 1300 of a weatherproof switch where a magnet is incorporated into the buttons 900, 1000, 1100, 1200, and 1300 by using an adhesive, such as glue, to secure the magnets to body of the buttons 900, 1000, 1100, 1200, and 1300. Button 900 includes a body 202h having an elongated stem 204h that extends from the top 208h to the bottom 214h of the button 900. Near the bottom 214h of the button 900 is a magnet 206h that maybe secured within the cavity 902 of the body 202h with an adhesive. The top 208h of the button 900 may be operated by a user by depressing or otherwise causing the top 208h to be depressed or moved relative to a sensor as discussed further below. The button 900 includes flexible side walls 210h that extend outwardly from the top 208h of the button 900, such that they flex when the top 208h is depressed or moved by a user. The arms 210h may extend to ends 212h that seal against a surface, such as housings 118, 120, and 122, for example. The arms 210h may be of a shape or thickness that allows for the body 202h to be moved relative to the ends 212h by applying a force, such as by pressing, on the top 208h of the button 900 causing the arms 210h to flex. A resistance to the force exerted by a user maybe stored in the arms 210h, such that they cause the body 202h of the button 900 to return to its original position once the force has been removed or ceased. In this embodiment, the cavity 902 may include an opening located near the bottom 214h of the body 202h to locate the magnet 206h nearer to one side of the body 202h than another. The side that the magnet 206h is located nearer to may also be the side that is more adjacent to a sensor as described herein.

Button 1000 includes a body 202i having an elongated stem 204i that extends from the top 208i to the bottom 214i of the button 1000. Near the bottom 214i of the button 1000 is a magnet 206i that may be secured within the cavity 1002 of the body 202i with an adhesive. The top 208i of the button 1000 may be operated by a user by depressing or otherwise causing the top 208*i* to be depressed or moved relative to a sensor as discussed further below. The button 1000 includes flexible side walls 210*i* that extend outwardly from the top 208*i* of the button 1000, such that they flex when the top 208*i* is depressed or moved by a user. The arms 210*i* may extend to ends 212*i* that seal against a surface, such as housings 118, 120, and 122, for example. The arms 210*i* maybe of a shape or thickness that allows for the body 202*i* to be moved relative to the ends 212*i* by applying a force, such as by pressing, on the top 208*i* of the button 1000 causing the arms 210*i* to flex. A resistance to the force exerted by a user may be stored in the arms 210*i*, such that they cause the body 202*i* of the button 1000 to return to its original position once the force has been removed or ceased. In this embodiment, the cavity 1002 may include an opening located near the bottom 214*i* of the body 202*i* to locate the magnet 206*i* more central to the bottom 214*i* than one side or the other. The location of the magnet 206*i* may be nearer to or more adjacent to a sensor as described herein.

Button 1100 includes a body 202*j*, absent an elongated stem as found in buttons 900 and 1000, that extends from the top 208*j* to the cavity 1102 of the button 1100. Located in the cavity 1102 is a magnet 206*j* that maybe secured within the cavity 1102 of the body 202*j* with an adhesive. The top 208*j* of the button 1100 may be operated by a user by depressing or otherwise causing the top 208*j* to be depressed or moved relative to a sensor as discussed further below. The button 1100 includes flexible side walls 210*j* that extend outwardly from the top 208*j* of the button 1100, such that they flex when the top 208*j* is depressed or moved by a user. The arms 210*j* may extend to ends 212*j* that seal against a surface, such as lenses 116, 124, and 126, for example. The arms 210*j* maybe of a shape or thickness that allows for the body 202*j* to be moved relative to the ends 212*j* by applying a force, such as by pressing, on the top 208*j* of the button 1100 causing the arms 210*j* to flex. A resistance to the force exerted by a user may be stored in the arms 210*j*, such that they cause the body 202*j* of the button 1100 to return to its original position once the force has been removed or ceased. In this embodiment, the cavity 1102 is located closer to the top 208*j* for using the button 1100 directly on lenses 116, 124, and 126 and/or housings 118, 120, and 122.

The location of the magnet 206*j* may be nearer to or more adjacent to a sensor located proximal to the magnet 206*j* because of the shortness of the body 202*j* of the button 1100. In this embodiment, the lower portion of the magnet 206*j* is shown substantially exposed. The adhesive provide a securing force within the cavity 1102, such that the magnet 206*j* may be exposed for operation with a sensor as described below. The adhesive may be located on any of the surfaces between the magnet 206*j* and the inner surfaces of the cavity 1102, for example.

Button 1200 includes a body 202*k*, also absent an elongated stem as found in buttons 900 and 1000, which extends from the top 208*k* to the cavity 1202 of the button 1200. Located in the cavity 1202 is a magnet 206*k* that may be secured within the cavity 1202 of the body 202*k* with an adhesive. The top 208*k* of the button 1200 may be operated by a user by depressing or otherwise causing the top 208*k* to be depressed or moved relative to a sensor as discussed further below. The button 1200 includes flexible side walls 210*k* that extend outwardly from the top 208*k* of the button 1200, such that they flex when the top 208*k* is depressed or moved by a user. The arms 210*k* may extend to ends 212*k* that seal against a surface, such as lenses 116, 124, and 126, for example. The arms 210*k* may be of a shape or thickness that allows for the body 202*k* to be moved relative to the ends 212*k* by applying a force, such as by pressing, on the top 208*k* of the button 1200 causing the arms 210*k* to flex. A resistance to the force exerted by a user may be stored in the arms 210*k* such that they cause the body 202*k* of the button 1200 to return to its original position once the force has been removed or ceased. In this embodiment, the cavity 1202 is located closer to the top 208*k* for using the button 1200 directly on lenses 116, 124, and 126 and/or housings 118, 120, and 122, for example. The location of the magnet 206*k* may be nearer to or more adjacent to a sensor located proximal to the magnet 206*k* because of the shortness of the body 202*k* of the button 1200. As with button 1100, the adhesive may secure the magnet 206*k* into the cavity 1202, such that a portion of the magnet 206*k* is exposed as shown for operation with a sensor as described herein.

Referring to buttons 1100 and 1200, there is a difference in the thickness of their respective bodies 202*j* and 202*k*. Body 202*k* has a slightly thicker portion extending from the top 208*k* to the cavity 1202 than button 1100. Similarly, the body 202*j* of button 1100 has a slightly thinner portion extending from the top 208*j* to the cavity 1102 than button 1200. These thicknesses of bodies may also be measured from the tops 208*j* and 208*k* to the top of the magnets 206*j* and 206*k* respectively. In one aspect, the amount of pressure or force necessary to operate buttons 1100 and 1200 may be designed by making the buttons 1100 and 1200 with bodies having a certain thickness, such that the material used will provide a desired resistance to the force or pressure exerted by a user. In another aspect, the type of material used for the bodies 202*j* and 202*k* may provide the desired resistance to force and pressure of a user in order to operate the buttons 1100 and 1200.

Button 1300 includes a body 202*l*, also absent an elongated stem as found in buttons 900 and 1000, which extends from the top 208*l* to the cavity 1302 of the button 1300. In this embodiment, the top 208*l* may include part of an exposed magnet 206*l*. Located in the cavity 1302 is the magnet 206*l* that may be secured within the cavity 1302 of the body 202*l* with an adhesive. In addition, adhesive may be applied to the top of the exposed magnet 206*l* and/or top 208*l* for additional adhesion and protection. The top 208*l* of the button 1300 may be operated by a user by depressing or otherwise causing the top 208*l* to be depressed or moved relative to a sensor as discussed further below. The button 1300 includes flexible side walls 210*l* that extend outwardly from the top 208*l* of the button 1300, such that they flex when the top 208*l* is depressed or moved by a user. The arms 210*l* may extend to ends 212*l* that seal against a surface, such as lenses 116, 124, and 126, for example. The arms 210*l* may be of a shape or thickness that allows for the body 202*l* to be moved relative to the ends 212*l* by applying a force, such as by pressing, on the top 208*l* of the button 1300 causing the arms 210*l* to flex. A resistance to the force exerted by a user may be stored in the arms 210*l*, such that they cause the body 202*l* of the button 1300 to return to its original position once the force has been removed or ceased. In this embodiment, the cavity 1302 is located closer to the top 208*l* for using the button 1300 directly on lenses 116, 124, and 126 and/or housings 118, 120, and 122, for example. The location of the magnet 206*l* may be nearer to or more adjacent to a sensor located proximal to the magnet 206*l* because of the shortness of the body 202*l* of the button 1300. As with buttons 1100 and 1200, the adhesive may secure the magnet 206*l* into the cavity 1302, such that a portion of the magnet 206*l* is exposed as shown for operation with a sensor as described herein.

Referring to FIGS. 14-18, illustrations are presented of embodiments of buttons 1400, 1500, 1600, 1700, and 1800 of a weatherproof switch where a magnet is incorporated into the buttons 1400, 1500, 1600, 1700, and 1800 by using a multi-piece body, such as a two-piece body, to secure the magnets to body of the buttons 1400, 1500, 1600, 1700, and 1800. Button 1400 includes a two-piece body 202m having an elongated stem 204m that extends from the top 208m to the bottom of the button 1400. Near the bottom of the button 1400 is a magnet 206m that maybe secured within the cavity 1402 of the body 202m by a second body piece or cap 1404. The top 208m of the button 1400 may be operated by a user by depressing or otherwise causing the top 208m to be depressed or moved relative to a sensor as discussed further below. The button 1400 includes flexible side walls 210m that extend outwardly from the top 208m of the button 1400, such that they flex when the top 208m is depressed or moved by a user. The arms 210m may extend to ends 212m that seal against a surface, such as housings 118, 120, and 122, for example. The arms 210m may be of a shape or thickness that allows for the body 202m to be moved relative to the ends 212m by applying a force, such as by pressing, on the top 208m of the button 1400 causing the arms 210m to flex. A resistance to the force exerted by a user may be stored in the arms 210m, such that they cause the body 202m of the button 1400 to return to its original position once the force has been removed or ceased. In this embodiment, the magnet 206m located in the cavity 1402 may be secured by the cap 1404. In this embodiment, the cap 1404 is located to one side of the 202m of the button 1400.

Button 1500 includes a two-piece body 202n having an elongated stem 204n that extends from the top 208n to the bottom of the button 1500. Near the bottom of the button 1500 is a magnet 206n that may be secured within the cavity 1502 of the body 202n by a second body piece or cap 1504. The top 208n of the button 1500 may be operated by a user by depressing or otherwise causing the top 208n to be depressed or moved relative to a sensor as discussed further below. The button 1500 includes flexible side walls 210n that extend outwardly from the top 208n of the button 1500, such that they flex when the top 208n is depressed or moved by a user. The arms 210n may extend to ends 212n that seal against a surface, such as housings 118, 120, and 122, for example. The arms 210n may be of a shape or thickness that allows for the body 202n to be moved relative to the ends 212n by applying a force, such as by pressing, on the top 208n of the button 1500 causing the arms 210n to flex. A resistance to the force exerted by a user may be stored in the arms 210n, such that they cause the body 202n of the button 1500 to return to its original position once the force has been removed or ceased. In this embodiment, the cavity 1502 may include an opening located near the bottom of the body 202n to locate the magnet 206n more central to the bottom than one side or the other. The location of the magnet 206n may be nearer to or more adjacent to a sensor as described herein. In this embodiment, the magnet 206n located in the cavity 1502 may be secured by the cap 1504. In this embodiment, the cap 1504 is located to one side of the 202n of the button 1500.

Button 1600 includes a two-piece body 202o, absent an elongated stem as found in buttons 1400 and 1500, that extends from the top 208o to the cavity 1602 of the button 1600. Located in the cavity 1602 is a magnet 206o that maybe secured within the cavity 1602 of the body 202o with a second body piece or cap 1604. The top 208o of the button 1600 may be operated by a user by depressing or otherwise causing the top 208o to be depressed or moved relative to a sensor as discussed further below. The button 1600 includes flexible side walls 210o that extend outwardly from the top 208o of the button 1600, such that they flex when the top 208o is depressed or moved by a user. The arms 210o may extend to ends 212o that seal against a surface, such as lenses 116, 124, and 126, for example. The arms 210o may be of a shape or thickness that allows for the body 202o to be moved relative to the ends 212o by applying a force, such as by pressing, on the top 208o of the button 1600 causing the arms 210o to flex. A resistance to the force exerted by a user may be stored in the arms 210o, such that they cause the body 202o of the button 1600 to return to its original position once the force has been removed or ceased. In this embodiment, the cavity 1602 is located closer to the top 208o for using the button 1600 directly on lenses 116, 124, and 126 and/or housings 118, 120, and 122. As shown, the magnet 206o is secured within the cavity 1602 by the cap 1604.

Button 1700 includes a body 202p, also absent an elongated stem as found in buttons 1400 and 1500, which extends from the top 208p to the cavity 1702 of the button 1700. Located in the cavity 1702 is a magnet 206p that may be secured within the cavity 1702 of the body 202p with a second body piece or cap 1704. The top 208p of the button 1700 may be operated by a user by depressing or otherwise causing the top 208p to be depressed or moved relative to a sensor as discussed further below. The button 1700 includes flexible side walls 210p that extend outwardly from the top 208p of the button 1700, such that they flex when the top 208p is depressed or moved by a user. The arms 210p may extend to ends 212p that seal against a surface, such as lenses 116, 124, and 126, for example. The arms 210p may be of a shape or thickness that allows for the body 202p to be moved relative to the ends 212p by applying a force, such as by pressing, on the top 208p of the button 1700 causing the arms 210p to flex. A resistance to the force exerted by a user maybe stored in the arms 210p, such that they cause the body 202p of the button 1700 to return to its original position once the force has been removed or ceased. In this embodiment, the cavity 1702 is located closer to the top 208p for using the button 1700 directly on lenses 116, 124, and 126 and/or housings 118, 120, and 122, for example. The location of the magnet 206p may be nearer to or more adjacent to a sensor located proximal to the magnet 206p because of the shortness of the body 202p of the button 1700. In this embodiment, the cavity 1702 is located closer to the top 208p for using the button 1700 directly on lenses 116, 124, and 126 and/or housings 118, 120, and 122. As shown, the magnet 206p is secured within the cavity 1702 by the cap 1704. In this embodiment, the cap 1704 maybe any thickness desirable to effect a desired flex to the button 1700.

Button 1800 includes a two-piece body 202q, also absent an elongated stem as found in buttons 1400 and 1500, which extends from the top 208q to the cavity 1802 of the button 1800. Located in the cavity 1802 is the magnet 206q that may be secured within the cavity 1802 of the body 202q with a second body piece or cap 1804. The top 208q of the button 1800 may be operated by a user by depressing or otherwise causing the top 208q to be depressed or moved relative to a sensor as discussed further below. The button 1800 includes flexible side walls 210q that extend outwardly from the top 208q of the button 1800, such that they flex when the top 208q is depressed or moved by a user. The arms 210q may extend to ends 212q that seal against a surface, such as lenses 116, 124, and 126, for example. The arms 210q may be of a shape or thickness that allows for the body 202q to be moved relative to the ends 212q by applying a force, such as by pressing, on the top 208q of the button 1800 causing the arms 210q to flex. A resistance to the force exerted by a user may be stored in the arms 210q, such that they cause the body 202q of the button 1800 to return to its original position once the force has been removed or ceased. In this embodiment, the cavity 1802 is located closer to the top 208*q* for using the button 1800 directly on lenses 116, 124, and 126 and/or housings 118, 120, and 122, for example. The location of the magnet 206*q* may be nearer to or more adjacent to a sensor located proximal to the magnet 206*q* because of the shortness of the body 202*q* of the button 1800. In this embodiment, the cavity 1802 is located closer to the top 208*q* for using the button 1800 directly on lenses 116, 124, and 126 and/or housings 118, 120, and 122. As shown, the magnet 206*q* is secured within the cavity 1802 by the cap 1804. In this embodiment, the cap 1804 is of a slightly lesser thickness than cap 1704.

Figure 19:
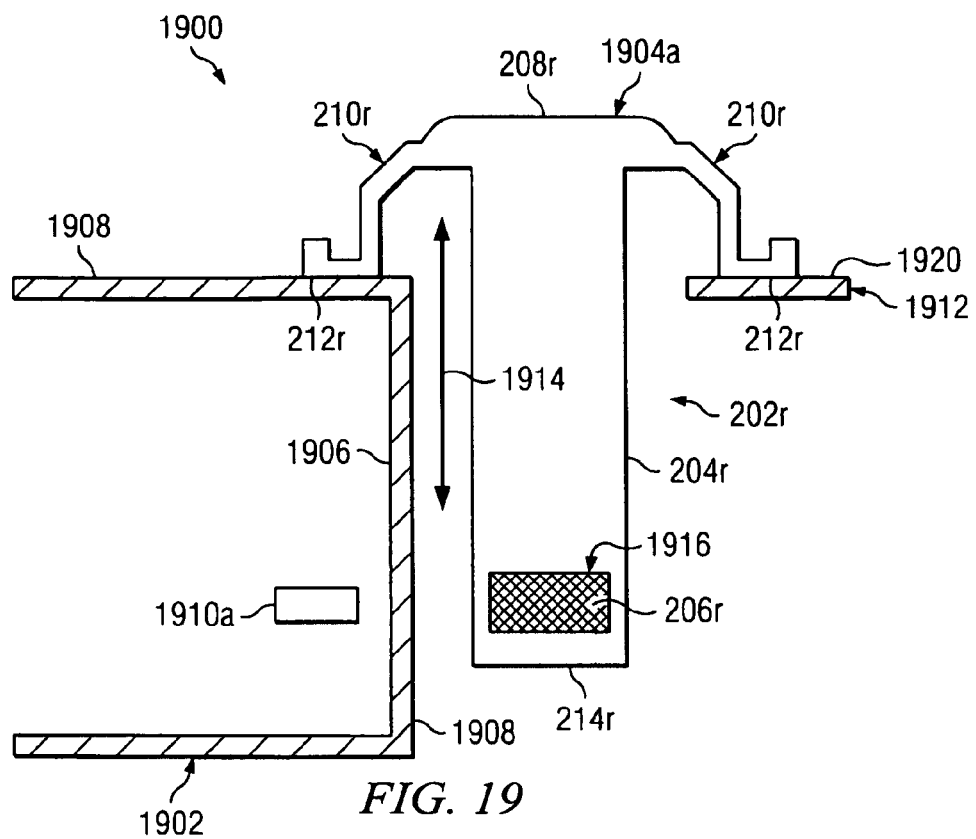
FIG. 19 is a cross-sectional view of an exemplary information/instrument cluster with a weatherproof switch having an elongated stem according to one embodiment of the present invention.

Referring to FIG. 19, an embodiment of a weatherproof switch 1900 including a sensor 1910*a* and a button 1904*a* is shown. The button 1904*a* includes a body 202*r* having an elongated stem 204*r* that extends from the top 208*r* to bottom 214*r* of the button 1904*a*. Located in the cavity 1916 of the button 1904*a* is a magnet 206*r* that may be secured within the cavity 1916 of the body 202*r* by any means described herein. The top 208*r* of the button 1904*a* may be operated by a user by depressing or otherwise causing the top 208*r* to be depressed or moved relative to the sensor 1910*a* in a direction noted as 1914. The button 1904*a* includes flexible side walls 210*r* that extend outwardly from the top 208*r* of the button 1904*a*, such that they flex when the top 208*r* is depressed or moved by a user. The arms 210*r* may extend to ends 212*r* that seal against a surface 1908 and 1920 of instrument housings 1902 and 1912, respectively. Instrument housing 1902 includes an inner surface 1906 and an outer surface 1908. The outer surface 1908 may include any or all of the outer or exterior surfaces of the instrument housing 1902, including lens surfaces and the like. Likewise, housing 1912 also may include a bottom surface and side surfaces (not shown), in addition to surface 1920. In another embodiment, any part of an instrument cluster may be used to support the weatherproof switch 1900.

In this embodiment, the ends 212*r* of the button 1904*a* are sealed or secured to the outer surface 1908 of housing 1902 and the outer surface 1920 of housing 1912; housing 1912 being the same or a different instrument as housing 1902. By being secured in place, the button 1904*a* may move in direction 1914, such as up and/or down, when operated by a user. The arms 210*r* may be of a shape or thickness that allows for the body 202*r* to be moved relative to the ends 212*r* by applying a force, such as by pressing, on the top 208*r* of the button 1904*a* causing the arms 210*r* to flex and the body 204*r* to move in the direction 1914. A resistance to the force exerted by a user may be stored in the arms 210*r*, such that they cause the body 202*r* of the button 1904*a* to return to its original position once the force has been removed or ceased. In this embodiment, the cavity 1916 is located in proximity to the sensor 1910*a*, such that when the button 1904*a* is operated the change in the magnetic force or field produced by the magnet 206*r* and caused by such movement is detected by the sensor 1910*a*.

In this embodiment, there is shown a distance between the sensor 1910*a* and the button 1904*a*. The button 1904*a* is located outside of the information/instrument cluster housing, such as between and outside two instrument housings 1902 and 1912. The location of the button 1904*a* is proximal to the outer surface 1908 and surface 1920, such that the sensor 1910*a* will be effected by the movement of the button 1904*a* while it is being operated. Its elongated stem 204*r* locates the magnet 206*r* closer to the bottom of the housing 1902 where the sensor 1910*a* is housed. As the button 1904*a* is operated in a downward and/or upward direction 1914, the sensor 1910*a* can detect the changes in the magnetic field and operate the circuit as described herein.

Figure 20:
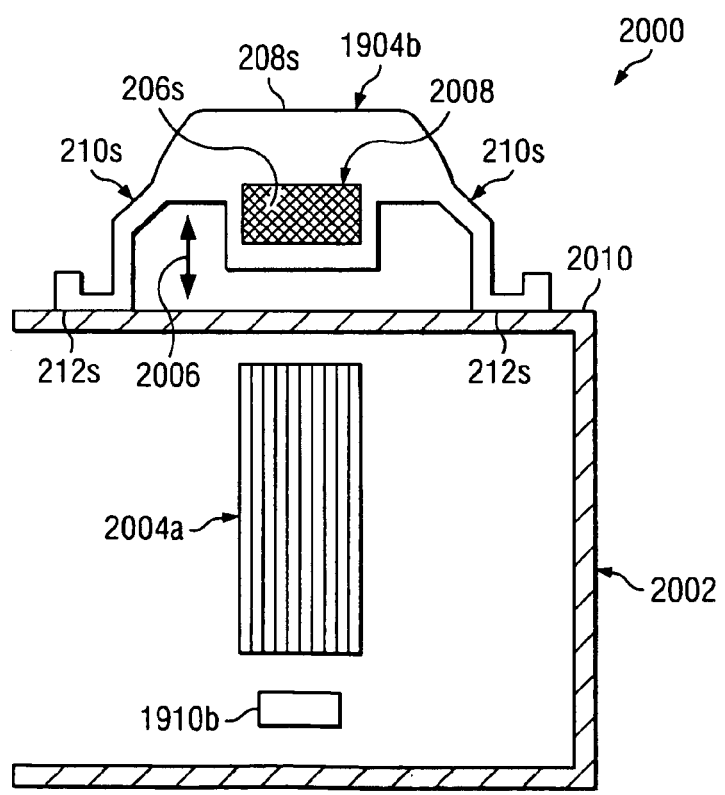
FIG. 20 is a cross-sectional view of an exemplary an information/instrument cluster with a weatherproof switch with a metal sleeve according to one embodiment of the present invention.

Referring to FIG. 20, an embodiment of a weatherproof switch 2000 including a sensor 1910*b* and a button 1904*b* is shown. The button 1904*b* includes a body 202*s*, which does not have an elongated stem as found in weatherproof switch 1900. Located in the cavity 2008 of the button 1904*b* is a magnet 206*s* that may be secure within the cavity 2008 of the button 1904*b* by any means described herein. The top 208*s* of the button 1904*b* may be operated by a user by depressing or otherwise causing the top 208*s* to be depressed or moved relative to the sensor 1910*b* in a direction noted as 2006. The button 1904*b* includes flexible side walls 210*s* that extend outwardly from the top 208*s* of the button 1904*b*, such that they flex when the top 208*s* is depressed or moved by a user. The arms 210*s* may extend to ends 212*s* that seal against a surface 2010 of housing 2002. The housing 2002 may be part of an instrument or cluster of instruments as described herein. Housing 2002 includes an inner surface and an outer surface 2010. The surface 2010 may include any or all of the outer or exterior surfaces of the instrument housing 2002, including lens surfaces and the like. Likewise, housing 2002 also may include a bottom surface and side surfaces (not shown), in addition to surface 2010. In another embodiment, any part of an instrument cluster may be used to support the weatherproof switch 2000.

In this embodiment, the ends 212*s* of the button 1904*b* are sealed or secured to the surface 2010 of housing 2002. By being secured in place, the button 1904*b* may move in direction 2006, such as up and/or down, when operated by a user. The arms 210*s* may be of a shape or thickness that allows for the body 202*s* to be moved relative to the ends 212*s* by applying a force, such as by pressing, on the top 208*s* of the button 1904*b* causing the arms 210*s* to flex and the arms 204*s* to move in the direction 2006. A resistance to the force exerted by a user may be stored in the arms 210*s*, such that they cause the body 202*s* of the button 1904*b* to return to its original position once the force has been removed or ceased. In this embodiment, the cavity 2008 is not located in proximity to the sensor 1910*b*. In this embodiment, the weatherproof switch 2000 may include a magnetic field guide 2004*a* located between the sensor 1910*b* and the button 1904*b*. The location of the sensor 1910*b* and the magnet 206*s* may separated by a distance sufficient to not cause the sensor 1910*b* from being effected by just the movement of the magnet 206*s*. In one embodiment, a focusing material, such as ferrite material, ferromagnetic, and the like, may be used as the magnetic field guide 2004*a* to focus the magnetic field between the magnet 206*s* and the sensor 1910*b*. In one aspect, the magnet 206*s* is embedded within the button 1904*b*, such that the distance between the sensor 1910*b* and the magnet 206*s* is significant enough that the magnetic field guide 2004*a* maybe used to transfer magnetic field changes to the sensor 1910*b*, such that when the button 1904*b* is operated the change in the magnetic force or field produced by the magnet 206*s* and caused by such movement is detected by the sensor 1910*b*.

Figure 21:
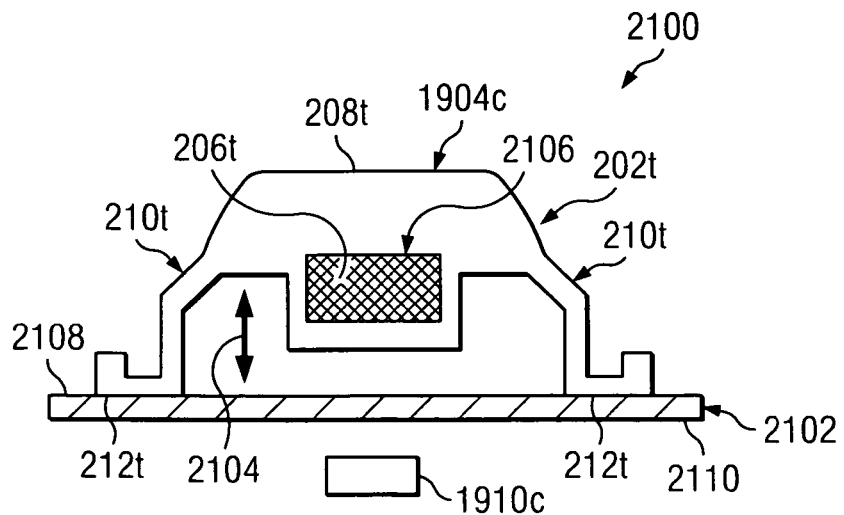
FIG. 21 is a cross-sectional view of an exemplary an information/instrument cluster with a weatherproof switch according to one embodiment of the present invention.

Referring to FIG. 21, an embodiment of a weatherproof switch 2100 including a sensor 1910*c* and a button 1904*c* is shown. The button 1904*c* includes a body 202*t*, which does not have an elongated stem as found in weatherproof switch 1900. Located in the cavity 2106 of the button 1904*c* is a magnet 206*t* that may be secure within the cavity 2106 of the button 1904*c* by any means described herein. The top 208*t* of the button 1904*c* may be operated by a user by depressing or otherwise causing the top 208*t* to be depressed or moved relative to the sensor 1910*c* in a direction noted as 2104. The button 1904*c* includes flexible side walls 210*t* that extend outwardly from the top 208*t* of the button 1904*c*, such that they flex when the top 208*t* is depressed or moved by a user.

The arms 210t may extend to ends 212t that seal against a surface 2108 of housing 2102. The housing 2102 may be part of an instrument or cluster of instruments as described herein. Housing 2102 may include an inner surface 2110 and an outer surface 2108. The surface 2108 may include any or all of the outer or exterior surfaces of the instrument housing 2102, including lens surfaces and the like. Likewise, housing 2102 also may include a bottom surface and side surfaces (not shown), in addition to surfaces 2110 and 2108. In another embodiment, any part of an instrument cluster may be used to support the weatherproof switch 2100.

In this embodiment, the ends 212t of the button 1904c are sealed or secured to the surface 2108 of housing 2102. By being secured in place, the button 1904c may move in direction 2104, such as up and/or down, when operated by a user. The arms 210t may be of a shape or thickness that allows for the body 202t to be moved relative to the ends 212t by applying a force, such as by pressing, on the top 208t of the button 1904c causing the arms 210t to flex and the arms 204t to move in the direction 2104. A resistance to the force exerted by a user may be stored in the arms 210t, such that they cause the body 202t of the button 1904c to return to its original position once the force has been removed or ceased. In this embodiment, the cavity 2106 is located in proximity to the sensor 1910c. In one aspect, the magnet 206t is embedded within the button 1904c, such that the distance between the sensor 1910c and the magnet 206t is not significant enough that a magnetic field guide maybe required to transfer magnetic field changes to the sensor 1910c.

Figure 22:
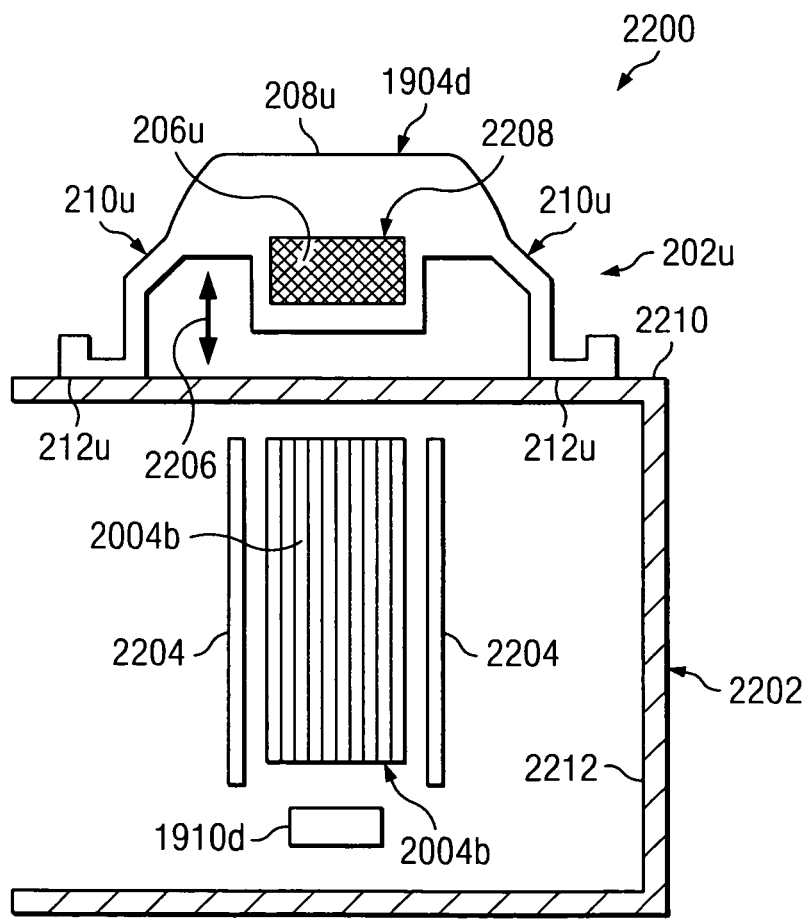
FIG. 22 is a cross-sectional view of an exemplary an information/instrument cluster with a weatherproof switch with a metal sleeve and ferrite according to one embodiment of the present invention.

Referring to FIG. 22, an embodiment of a weatherproof switch 2200 including a sensor 1910d and a button 1904d is shown. The button 1904d includes a body 202u, which does not have an elongated stem as found in weatherproof switch 1900. Located in the cavity 2208 of the button 1904d is a magnet 206u that may be secure within the cavity 2208 of the button 1904d by any means described herein. The top 208u of the button 1904d may be operated by a user by depressing or otherwise causing the top 208u to be depressed or moved relative to the sensor 1910d in a direction noted as 2206. The button 1904d includes flexible side walls 210u that extend outwardly from the top 208u of the button 1904d, such that they flex when the top 208u is depressed or moved by a user. The arms 210u may extend to ends 212u that seal against a surface 2210 of housing 2202. The housing 2202 may be part of an instrument or cluster of instruments as described herein. Housing 2202 includes an inner surface 2212 and an outer surface 2210. The surface 2210 may include any or all of the outer or exterior surfaces of the instrument housing 2202, including lens surfaces and the like. Likewise, housing 2202 also may include a bottom surface and side surfaces (not shown), in addition to surface 2210. In another embodiment, any part of an instrument cluster may be used to support the weatherproof switch 2200.

In this embodiment, the ends 212u of the button 1904d are sealed or secured to the surface 2210 of housing 2202. By being secured in place, the button 1904d may move in direction 2206, such as up and/or down, when operated by a user. The arms 210u may be of a shape or thickness that allows for the body 202u to be moved relative to the ends 212u by applying a force, such as by pressing, on the top 208u of the button 1904d causing the arms 210u to flex and the arms 204u to move in the direction 2206. A resistance to the force exerted by a user may be stored in the arms 210u, such that they cause the body 202u of the button 1904d to return to its original position once the force has been removed or ceased. In this embodiment, the cavity 2208 and magnet 206u is not located in proximity to the sensor 1910d. In this embodiment, the weatherproof switch 2200 may include a magnetic field guide 2004b and metal sleeves 2204 located between the sensor 1910d and the button 1904d. The location of the sensor 1910d and the magnet 206u may be separated by a distance sufficient to not cause the sensor 1910d from being effected by just the movement of the magnet 206u without the use of the magnetic field guide 2004b and metal sleeves 2204. In one embodiment, a focusing material, such as ferrite material, ferromagnetic, and the like, may be used as the magnetic field guide 2004b to focus the magnetic field between the magnet 206u and the sensor 1910d. In one aspect, the magnet 206u is embedded within the button 1904d, such that the distance between the sensor 1910d and the magnet 206u is significant enough that the magnetic field guide 2004a may be used to transfer magnetic field changes to the sensor 1910d, such that when the button 1904d is operated the change in the magnetic force or field produced by the magnet 206u and caused by such movement is detected by the sensor 1910d.

Figure 23:
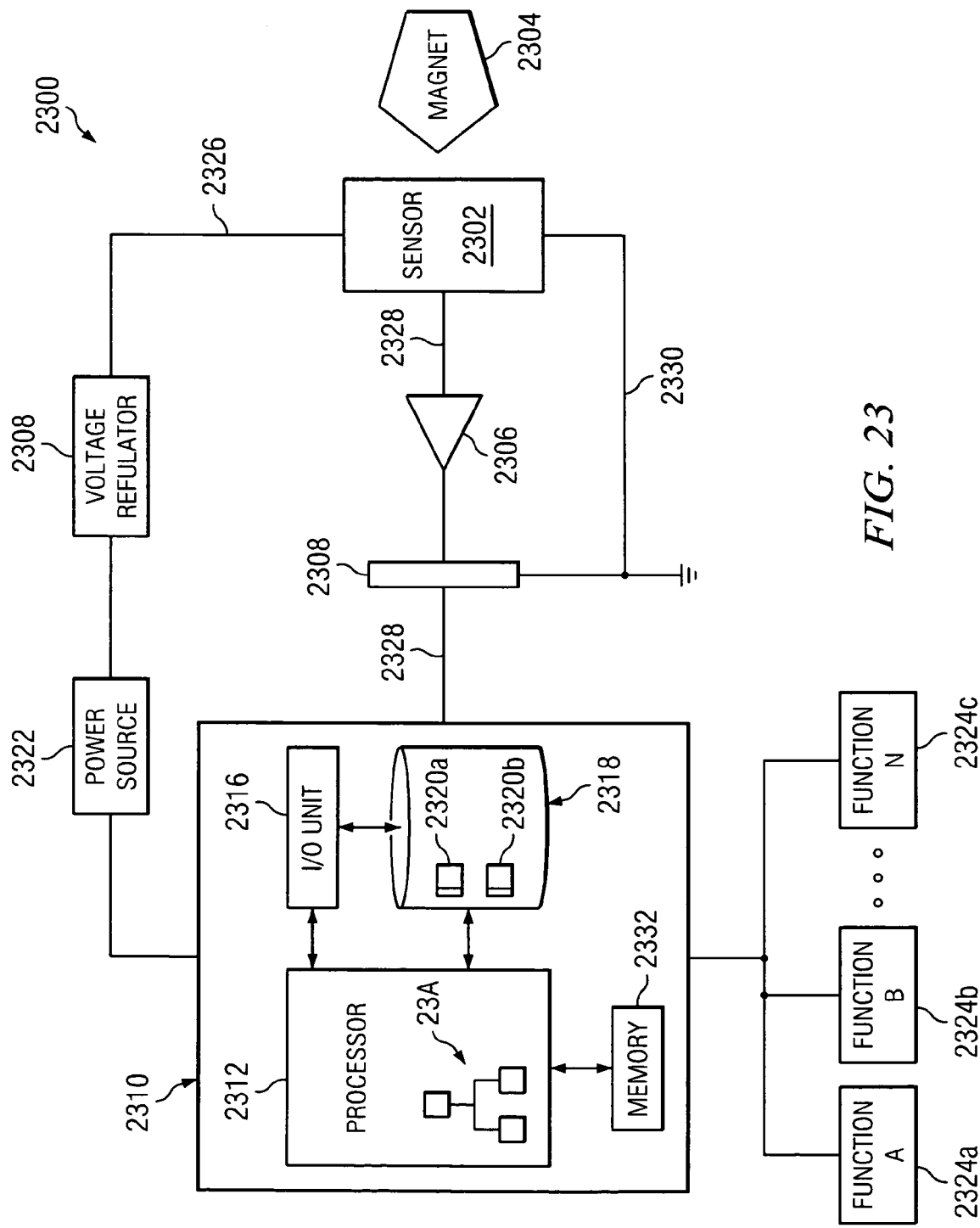
FIG. 23 illustrates a block diagram of an weatherproof switch and according to an embodiment of the present invention.

FIG. 23 is a schematic diagram of an embodiment of a circuit 2300 for a weatherproof switches 102, 104, 106, 108, 1900, 2000, 2100, and 2200 in an information/instrument cluster 100. The weatherproof switches 102, 104, 106, 108, 1900, 2000, 2100, and 2200 may include a sensor 2302 and a magnet 2304 for detecting the movement of buttons 200-1800, for example. In one embodiment, the magnet 2304 may represent magnets 206a-206u (collectively magnet 206). Additionally, sensor 2302 may represent sensors 1910a-1910d (collectively 1910). In one embodiment, the sensor 2302 is connected to three wires, terminals, and/or connections 2326, 2328, and 2330. Connection 2326 may supply a reference voltage from a power source 2322 through a voltage regulator 2308. The power source 2322 may be any power source, such as the power source associated with a particular vehicle having a information/instrument cluster 100. Some exemplary voltages may be 5V or 12V as supplied by a vehicle. As described further below, an onboard computer 2310 may further control the reference voltage supplied to the sensor 2302. In one aspect, the reference voltage is used to create the switching effect that takes place inside the sensor. Connection 2330 may be connected to a ground and connection magnet 2304 may be connected to an amplifier 2306 and a signal switcher 2308 for providing an output signal to the computer 2310 for operating functions 2324a-2324n (collectively 2324) on a vehicle, for example.

In one aspect, the computer 2310 may include a processor 2312 that execute software 2316, for example. The processor 2312 may be in communication with a memory 2332, an input/output ("I/O") unit 2316, and storage units 2318. The storage units 2318 may store databases or data repositories 2320a-2320b, for example. The software 2316 may include instructions for execution by the processor 2312 for providing reference voltages and instructions, control, and/or commands to functions 2324.

In one embodiment, sensors 1910 and 2302 may be a transducer, such as a Hall effect sensor. In this embodiment, the sensors 1910 and 2302 may vary its output voltage in response to changes in the magnetic field due to the magnets 206 and 2304 moving, closer or farther, from the sensors 1910 and 2302 as the buttons 200-1800 are operated. In one aspect, the sensors 1910 and 2302 may operate as an analog transducer directly returning voltage through its circuit 2300, as described herein. The circuit 2300 and the sensors 1910 and 2302 may act in a digital (on/off) mode, and may be a switch or Hall effect sensor switch, for example.

The weatherproof switches 102, 104, 106, 108, 1900, 2000, 2100, and 2200 may operate any desirable function, apparatus, device, subsystem, and the like. The weatherproof switches 102, 104, 106, 108, 1900, 2000, 2100, and 2200 may operate any electrical, mechanical, pneumatic, etc., type of subsystems. In one aspect, the information/instrument cluster 100 may use weatherproof switches 102, 104, 106, 108, 1900, 2000, 2100, and 2200 to enable a user to interface with functions of the information/instrument cluster 100. Some exemplary functions of the information/instrument cluster 100 include switches between trip information, switches between tachometer and speedometer displays, displaying clock, setting clock, display altitude, display temperature, switch between metric and imperial units, trigger external function such as lights or buzzers, and the like.

The information/instrument cluster 100 may be used on indoor and/or outdoor vehicles, such as snowmobiles, boats, motorcycles, scooters, all-terrain vehicles, and any indoor and/or outdoor equipment where prevention of moisture or water into the interior of a information/instrument cluster 100 is desirable or crucial to the proper operation of the information/instrument cluster 100.

The buttons 200-1800 may be made of any flexible type material that may preferably be waterproof or water-repellant. The buttons 200-1800 may be molded to fit a desired shape or use with the information/instrument cluster 100. Some exemplary materials include natural rubbers, sponge rubbers, synthetic rubbers, thermoplastic rubbers, latex rubber, sodium polysulfide, polychloroprene, butadiene-stryene copolymers, acrylonitrilebutadiene copolymers, ethylenepropylene-diene rubbers, synthetic polyisoprene, butyl rubber, polyacrylonitril, silicone, epicholohydrin, polyurethane, propylene/EPDM, styrene/ethylene-butylene, thermoplastics, plastics, polymers, and the like.

In one embodiment, the weatherproof switch 108 may include a flexible lens material or a portion of the lens 126 maybe a flexible material. In this embodiment, the weatherproof switch 108 is incorporated into the actual instrument 114. The material of the lens 126 maybe of any thickness and/or material type that does not substantially impede or shield the magnetic field from a magnet 206 from the sensor 1910. The flexible portion of the lens 126 and/or instrument 114 may then be operated by a user causing the magnet 206 to move relative to the sensor 1910, thus causing the circuit 2300 to operate or control the desired function.

The interference fit as described herein may be a fastening of the magnet 206 with a body 202 by friction between the openings or cavities of the body 202 and the magnet 206. It may be achieved by incorporating a magnet 206 that is slightly larger than the opening or cavity of the body 202, such that the body 202 compresses against the magnet 206 to secure it within the body 202.

Button 600, 700, and 800 may have the magnets 206e-206g molded into the bodies 202e-202g during the process of the bodies body 202e-202g. For example, the magnets 206e-206g maybe placed in a mold, such as an injection mold, prior injecting the material into the mold, thus causing the magnets 206e-206g to be molded or overmolded into the bodies body 202e-202g.

Buttons 900, 1000, 1100, 1200, and 1300 may have magnets 206h-206l that are manufactured separately and then secured in the cavities 902-1302 with an adhesive. The adhesive may be placed in the cavities 902-1302 first and then the magnets 206h-206l may be placed into the cavities where the adhesive will secure the magnets 206h-206l to the bodies 202h-202l of the buttons 900, 1000, 1100, 1200, and 1300.

The adhesives may include any substance, inorganic or organic, natural or synthetic, that is capable of bonding the magnets 206h-206l to the bodies 202h-202l by surface attachment. Some exemplary adhesives include: soluble silicates, phosphate cements, Portland cement, hydraulic cements, mortar, gypsum, ceramic, thermosetting powdered glasses, animal hide, or bone glue, casein glues, vegetable adhesives, soybean starch cellulosics, rubber latex, gums, terpene resins, rosin, pitches, hydrocarbon resins, elastomer-solvent cements, polysulfide sealants, thermoplastic resins (hot melts), polyethylene, isobutylene, polyamides, polyvinyl acetate, thermosetting resins, epoxies, phenoformaldehyde, polyvinyl butyral, cyanoacrylates, acrylics, polyureas, silicone polymers, cements, and the like.

The magnets 206 may be made from any material that will produce a magnetic field that is capable of being detected by a sensor 1910. The material may produce a magnetic field associated with magnetism, electromagnetism, ferromagnetism, paramagnetism, diamagnetism, stationary dipoles, steady currents, magnetostatics, and the like. The magnetic field guide 2004a and 2004b (collectively 2004) may be any type or shape of ferromagnetic material to guide the magnetic field to the sensor.

In one embodiment, the button, magnet, magnetic field guide, and/or sensor may be manufactured into a stand-alone switch, which may communicate with information clusters, through analog, digital, and/or wireless communication means.

The previous detailed description of a small number of embodiments for implementing the invention is not intended to be limiting in scope. One of skill in this art will immediately envisage the methods and variations used to implement this invention in other areas than those described in detail. The following claims set forth a number of the embodiments of the invention disclosed with greater particularity.

What is claimed:

1. An information/instrument cluster for use on a vehicle, comprising: a first instrument having a housing, the housing having an interior and an exterior; a button having an elongated body located adjacent to the exterior of the housing, the elongated body having a first end and a second end; a magnet substantially disposed within the second end of the elongated body; a sensor located a distance from the magnet to produce a magnetic field of a first strength; the sensor located in the interior of the housing a circuit connecting the sensor to a function of the information/instrument cluster for controlling the function when the first end of the button is operated to increase and decrease the distance between the magnet and the sensor such as to produce a magnetic field of a second strength; and a magnetic field guide, and metal sleeves completely located between the magnet and the sensor, the metal sleeves surrounding the magnetic field guide; the magnetic field guide transferring magnetic field changes from the magnet to the sensor, wherein the magnetic field guide is not in contact with the magnet.

2. The information/instrument cluster for use on a vehicle of claim 1, further comprising: a second instrument having a housing having an interior and an exterior, the housing located substantially proximal to the housing of the first instrument, wherein the button is connected to both of the exteriors of the housings of the first instrument housing and the second instrument.

* * * * *